(12) United States Patent
Huang

(10) Patent No.: US 10,840,343 B1
(45) Date of Patent: Nov. 17, 2020

(54) SEMICONDUCTOR STRUCTURE FOR WIDE BANDGAP NORMALLY OFF MOSFET

(71) Applicant: Chih-Jen Huang, Hsinchu (TW)

(72) Inventor: Chih-Jen Huang, Hsinchu (TW)

( * ) Notice: Subject to any disclaimer, the term of this patent is extended or adjusted under 35 U.S.C. 154(b) by 0 days.

(21) Appl. No.: 16/671,549

(22) Filed: Nov. 1, 2019

(51) Int. Cl.
*H01L 29/40* (2006.01)
*H01L 29/20* (2006.01)
*H01L 29/778* (2006.01)
*H01L 29/205* (2006.01)

(52) U.S. Cl.
CPC ........ *H01L 29/408* (2013.01); *H01L 29/2003* (2013.01); *H01L 29/205* (2013.01); *H01L 29/402* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 9,431,527 B1* | 8/2016 | Luo | H01L 29/4236 |
| 2016/0240646 A1 | 8/2016 | Chiu et al. | |
| 2018/0061630 A1* | 3/2018 | Odnoblyudov | H01L 21/02428 |

FOREIGN PATENT DOCUMENTS

CN    105870164 A    8/2016

* cited by examiner

*Primary Examiner* — Thien F Tran
(74) *Attorney, Agent, or Firm* — Muncy, Geissler, Olds & Lowe, P.C.

(57) ABSTRACT

A semiconductor structure for a wide bandgap normally off MOSFET has a III-group nitride, a V-group nitride, or a high K material trapping layer disposed under a gate electrode. Through the FN tunneling effect or channel hot electron (CHE) effect, multiple electrons are trapped by the trapping layer and kept in the trapping layer. The electrons in the trapping layer deplete the two-dimensional electron gas (2DEG) below the trapping layer, and then the 2DEG below the gate electrode disappear.

10 Claims, 14 Drawing Sheets

US 10,840,343 B1

SEMICONDUCTOR STRUCTURE FOR WIDE BANDGAP NORMALLY OFF MOSFET

BACKGROUND OF THE INVENTION

Field of the Invention

The invention relates to a metal-oxide-semiconductor field-effect transistor (MOSFET) semiconductor structure, more specifically to a semiconductor structure for a wide bandgap normally off MOSFET.

Description of the Related Art

One approach to create a normally off MOSFET is by forming a floating gate (FG) that is a semiconductor layer with insulators of oxide layers (0) disposed around the floating gate (FG) as shown in FIG. 1. Thus, the stored electrons can be kept in the floating gate (FG) for a long time.

The conventional oxide layer on the gallium nitride (GaN) layer or the III-V group wide bandgap semiconductor cannot be grown by thermal oxidation, so the oxide layer tends to have multiple defects. Due to the oxide defects or the high-temperature environment, the electrons tend to leak from the floating gate (FG). Therefore, the number of electrons in the floating gate decreases, and the threshold voltage $V_T$ changes significantly.

Furthermore, in order to inject the electrons into the floating gate (FG) to achieve the normally off state in the process of forming the conventional normally off MOSFET semiconductor structure, the source electrode (Source), the gate electrode (Gate), and the drain electrode (Drain) need to be applied with high voltages (e.g., the source electrode Source is applied with the voltage of 0V, the gate electrode Gate is applied with the voltage of 20V, and the drain electrode Drain is applied with the voltage of 50V) by channel hot electron (CHE) injection. In order to decrease the influence of the defects of the oxide layer, the oxide layer has increased thickness to reduce the number of electrons leaking from the floating gate FG.

BRIEF SUMMARY OF THE INVENTION

One objective of the invention is to provide a semiconductor structure for a wide bandgap normally off MOSFET having the III-V group transistor structure.

Another objective of the invention is to provide a semiconductor structure for a wide bandgap normally off MOSFET that has a trapping layer that is a non-semiconductor layer.

An additional objective of the invention is to provide a semiconductor structure for a wide bandgap normally off MOSFET capable of preventing electrons after being trapped in a trapping layer from leaking through the trapping layer.

Furthermore, another objective of the invention is to provide a semiconductor structure for a wide bandgap normally off MOSFET capable of decreasing the thickness of the oxide layer or the dielectric layer around the trapping layer.

The invention provides a semiconductor structure for a wide bandgap normally off MOSFET. The structure includes a substrate, a buffer layer disposed on the substrate, a barrier layer (which is disposed on the buffer layer and covers the buffer layer, where the interface between the buffer layer and the barrier layer has a two-dimensional electron gas (2DEG)) a source electrode, a drain electrode, and a gate electrode. The source electrode and the drain electrode are disposed on the buffer layer, and the source electrode and the drain electrode are disposed on two opposite sides of the gate electrode to control a current flowing through the 2DEG A III-group nitride, a V-group nitride, or a high K material trapping layer is disposed under the gate electrode. Through the FN tunneling effect or channel hot electrons effect, multiple electrons are trapped by the trapping layer and kept in the trapping layer. The electrons trapped in the trapping layer deplete the 2DEG below the gate electrode so that the structure forms a normally off MOSFET semiconductor structure.

DETAILED DESCRIPTION OF THE INVENTION

Figure 1:
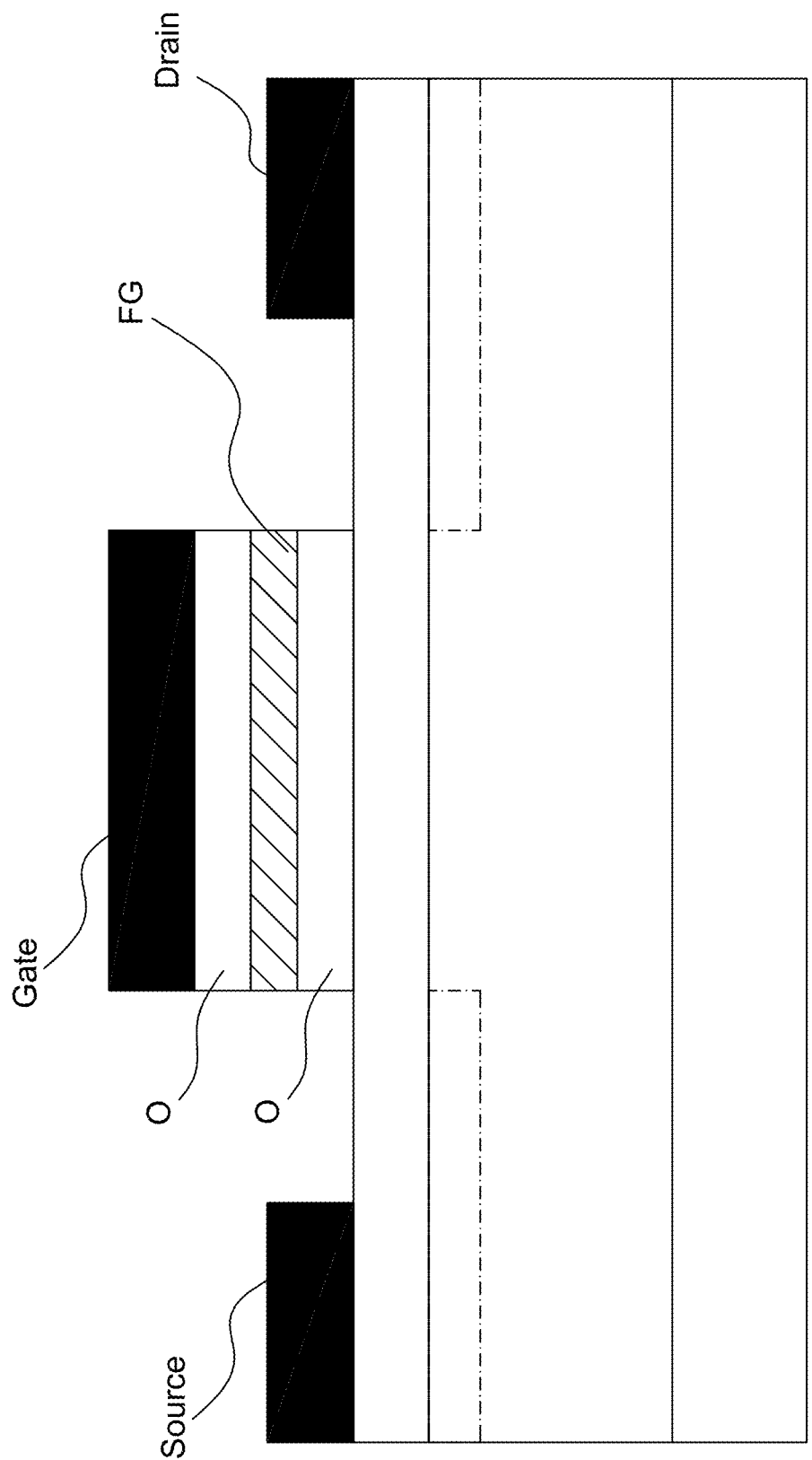
FIG. 1 is a schematic view showing a prior art.
Figure 2A:
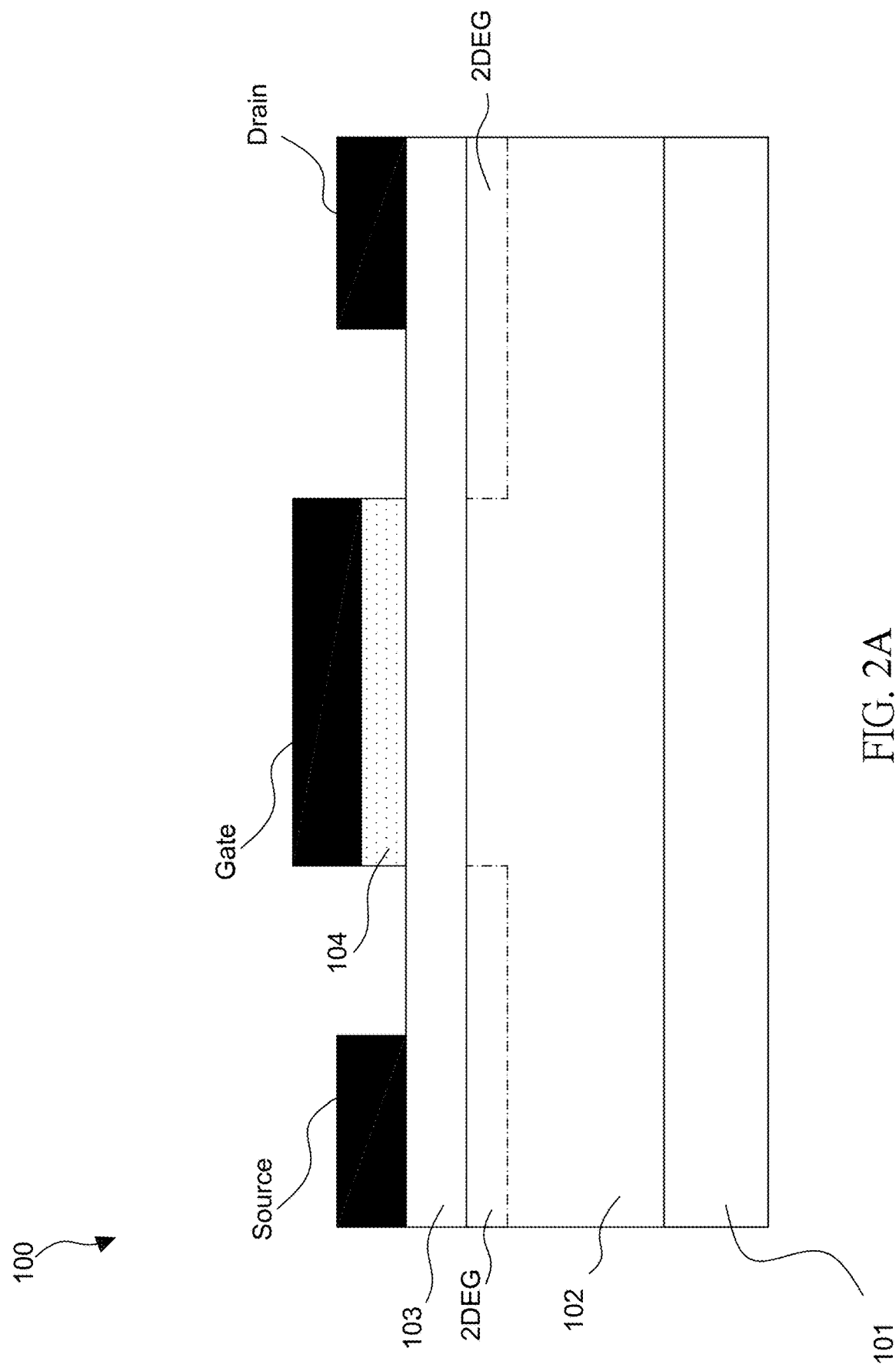
FIG. 2A is a schematic view showing a semiconductor structure for a wide bandgap normally off MOSFET according to an embodiment of the invention.

FIG. 2A is a schematic view showing a semiconductor structure for a wide bandgap normally off MOSFET according to an embodiment of the invention. Referring to FIG. 2A, the invention provides a semiconductor structure 100 for a wide bandgap normally off MOSFET. The structure 100 includes a substrate 101, a buffer layer 102, a barrier layer 103, a source electrode Source, a drain electrode Drain, and a gate electrode Gate.

The buffer layer 102 is disposed on the substrate 101. The barrier layer 103 is disposed on the buffer layer 102 and covers the buffer layer 102. The interface between the buffer layer 102 and the barrier layer 103 has a two-dimensional electron gas (hereinafter referred to as 2DEG). The source electrode Source and the drain electrode Drain are disposed on barrier layer 103, and are disposed on two opposite sides of the gate electrode Gate to control the current flowing through the 2DEG The structure 100 further includes a III-group nitride, a V-group nitride, or a high K material trapping layer 104, which is a non-semiconductor material, and disposed below the gate electrode Gate. Through the FN tunneling effect or channel hot electron (CHE) effect, multiple electrons are injected into the trapping layer 104 so that the electrons are trapped and kept in the trapping layer 104. The electrons in the trapping layer 104 deplete the 2DEG below the trapping layer 104, and then the 2DEG below the gate electrode Gate disappears. Thus, the structure 100 thereof forms a normally off MOSFET semiconductor structure.

Figure 2B:
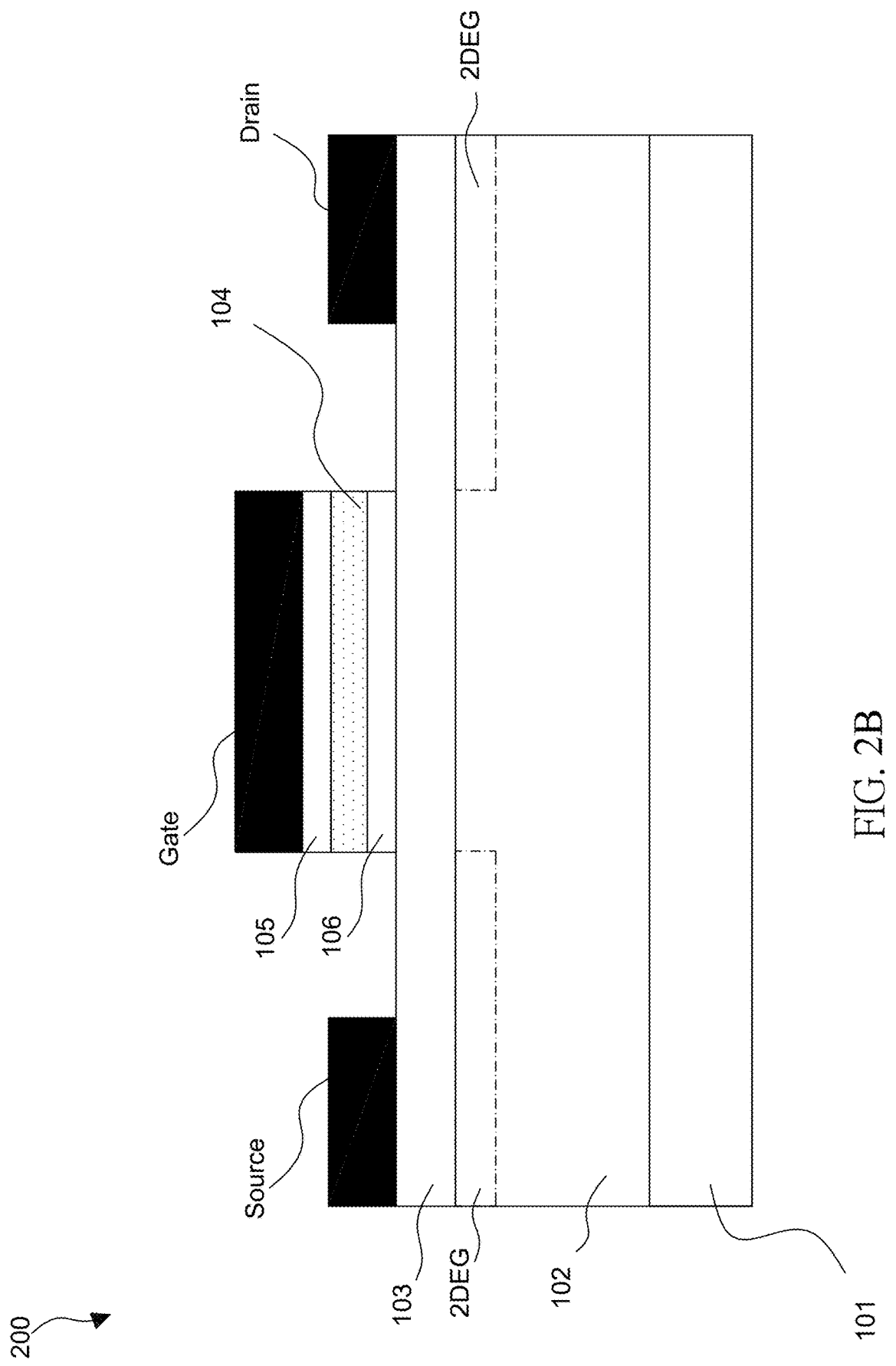
FIG. 2B is a schematic view showing a semiconductor structure for a wide bandgap normally off MOSFET according to an embodiment of the invention.

In this embodiment, it is to be noted that the electrons can be injected into the trapping layer 104 in this structure 100 via channel hot electron injection or the FN tunneling effect. For channel hot electron (CHE), the gate is higher than or equal to 5V, source is grounded, and drain is larger than or equal to 3V. For FN tunneling, the voltage of the gate electrode Gate is higher than or equal to 10 volts and the source electrode Source and drain electrode Drain are grounded. FIG. 2B is a schematic view showing a semiconductor structure 200 for a wide bandgap normally off MOSFET according to an embodiment of the invention. Referring to FIG. 2B, the difference between the structures 200 and 100 resides in that the structure 200 further includes oxide layers 105 and 106. The oxide layer 105 is disposed between the gate electrode Gate and the trapping layer 104, and the oxide layer 106 is disposed between the trapping layer 104 and the barrier layer 103.

In this embodiment, when the trapping layer 104 is implemented by a III-group nitride (e.g., AlxNy), V-group nitride (e.g., $Si_3N_4$), or a high K material, the oxide layers 105 and 106 are implemented by silicon dioxide ($SiO_2$).

Figure 2C:
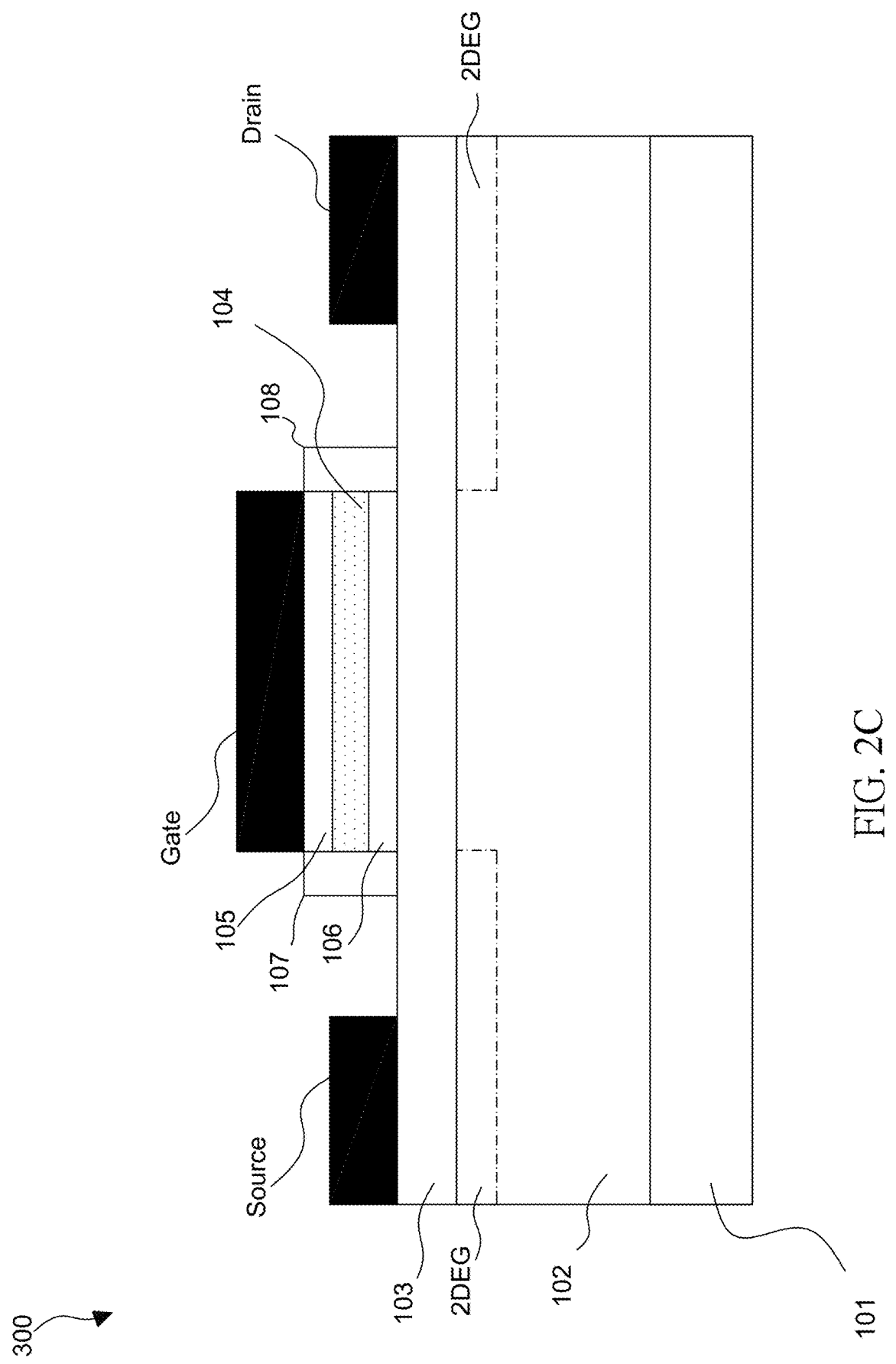
FIG. 2C is a schematic view showing a semiconductor structure for a wide bandgap normally off MOSFET according to an embodiment of the invention.

FIG. 2C is a schematic view showing a semiconductor structure 300 for a wide bandgap normally off MOSFET according to an embodiment of the invention. Referring to FIG. 2C, the difference between the structures 300 and 200 resides in that the structure 300 further includes oxide layers 107 and 108. The oxide layers 107 and 108 are disposed on the barrier layer 103, and respectively cover both side surfaces of each of the trapping layer 104 and the oxide layers 105 and 106.

Figure 2D:
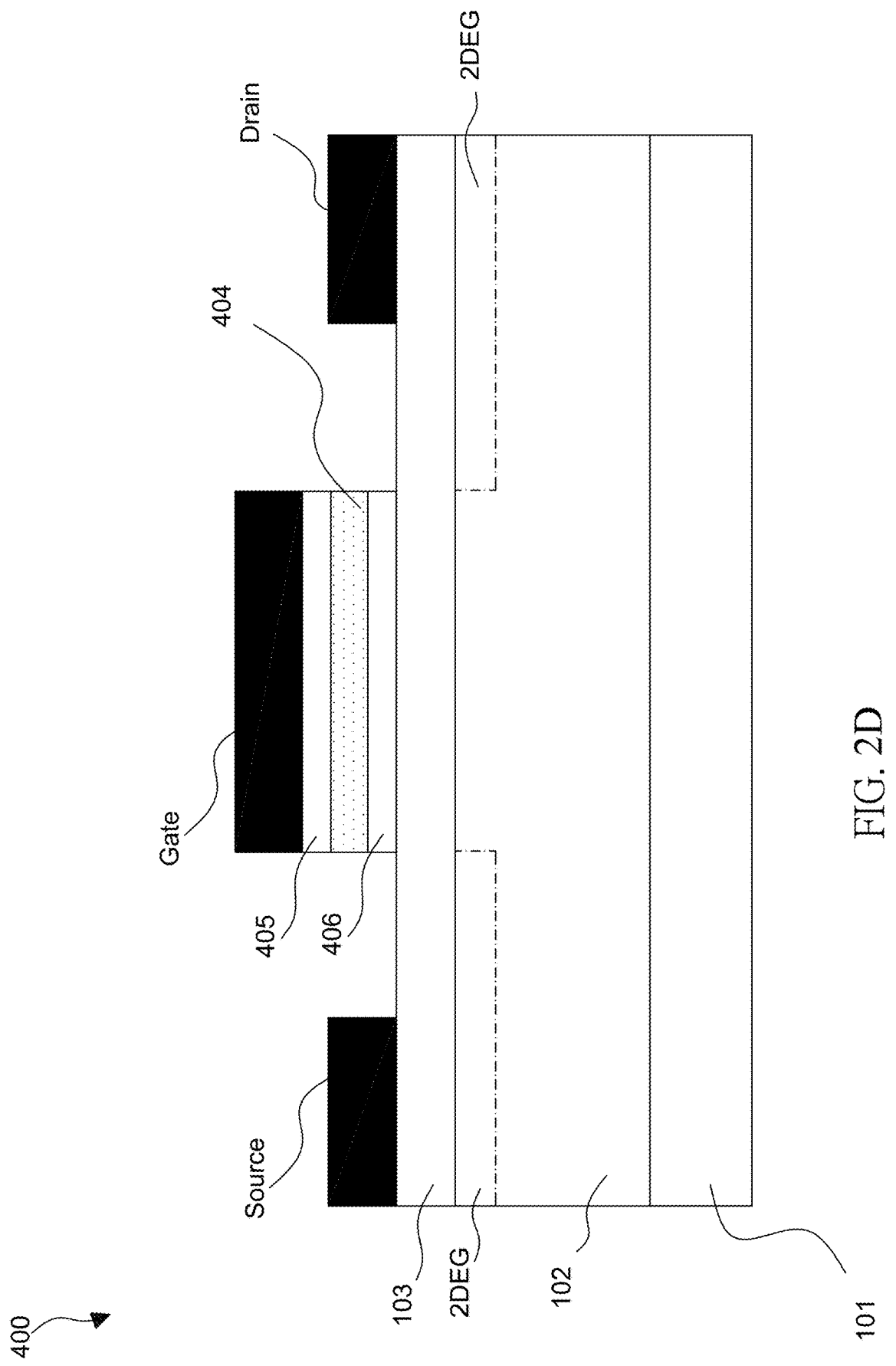
FIG. 2D is a schematic view showing a semiconductor structure for a wide bandgap normally off MOSFET according to an embodiment of the invention.

FIG. 2D is a schematic view showing a semiconductor structure 400 for a wide bandgap normally off MOSFET according to an embodiment of the invention. Referring to FIG. 2D, the difference between the structures 400 and 100 is that a trapping layer 404 is implemented by a III-group nitride or V-group nitride (e.g., $Si_3N_4$), and the structure 400 is implemented by dielectric layers 405 and 406. The dielectric layer 405 is disposed between the gate electrode Gate and the trapping layer 404, and the dielectric layer 406 is disposed between the trapping layer 404 and the barrier layer 103.

In this embodiment, when the trapping layer 404 is implemented by a V-group nitride, each of the dielectric layers 405 and 406 is implemented by the high K material, such as $Al_2O_3$, $HfO_2$, $HfAlO_x$ or $Ta_2O_5$; when each of the dielectric layers 405 and 406 is implemented by oxide layer, the trapping layer 404 could be implemented by a III-group nitride or V-group nitride.

Please note that due to the material property of the trapping layer 404 and the bonding defects, the trapping layer 404 tends to form trapping centers and has lower potential compared with the surrounding material. Therefore, after the electrons are trapped in trapping layer 404, the electrons cannot flow freely in trapping layer 404. In addition, the positions of the electrons trapped by the trapping layer 404 initially approach the dielectric layer 406, and the electrons are gradually stacked so that the positions thereof become gradually further from the dielectric layer 406. This characteristic is different from that of the conventional floating gate, where the electrons flow along the grain boundary and tend to leak from the floating gate.

Figure 2E:
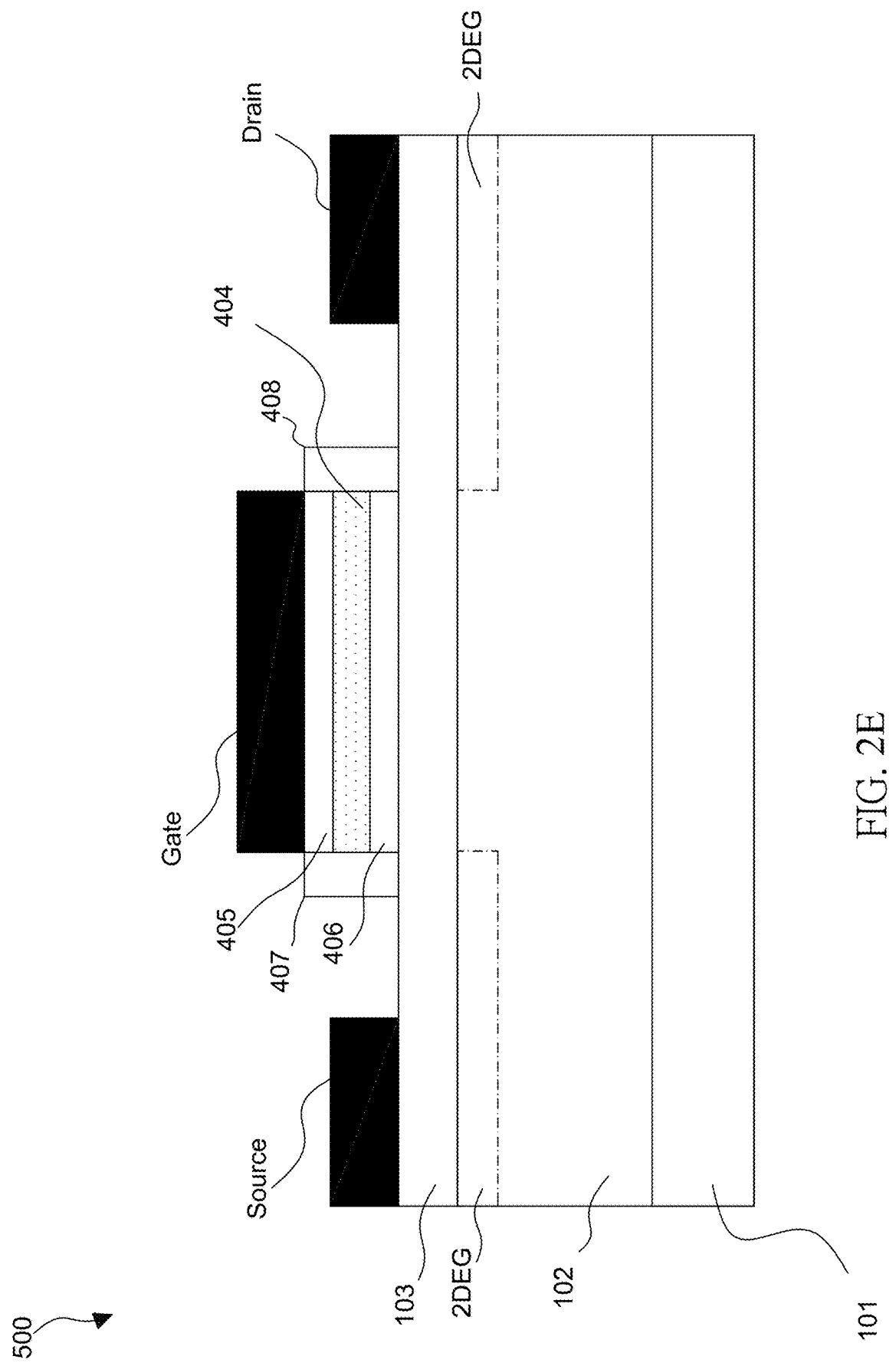
FIG. 2E is a schematic view showing a semiconductor structure for a wide bandgap normally off MOSFET according to an embodiment of the invention.

FIG. 2E is a schematic view showing a semiconductor structure 500 for a wide bandgap normally off MOSFET according to an embodiment of the invention. Referring to FIG. 2E, the difference between the structures 500 and 400 is that the structure 500 further includes dielectric layers 407 and 408, which are disposed on the barrier layer 103, and respectively cover two side surfaces of each of the trapping layer 404 and the dielectric layers 405 and 406.

Please note that, in one embodiment, the effective thickness of the trapping layer ranges from 4 to 16 nanometers, the effective thickness of the oxide layer 105 or the dielectric layer 405 on the trapping layer ranges from 8 to 12 nanometers, and the effective thickness of the oxide layer 106 below the trapping layer ranges from 6 to 12 nanometers or the effective thickness of the dielectric layer 406 ranges from 6 to 10 nanometers.

Figure 2F:
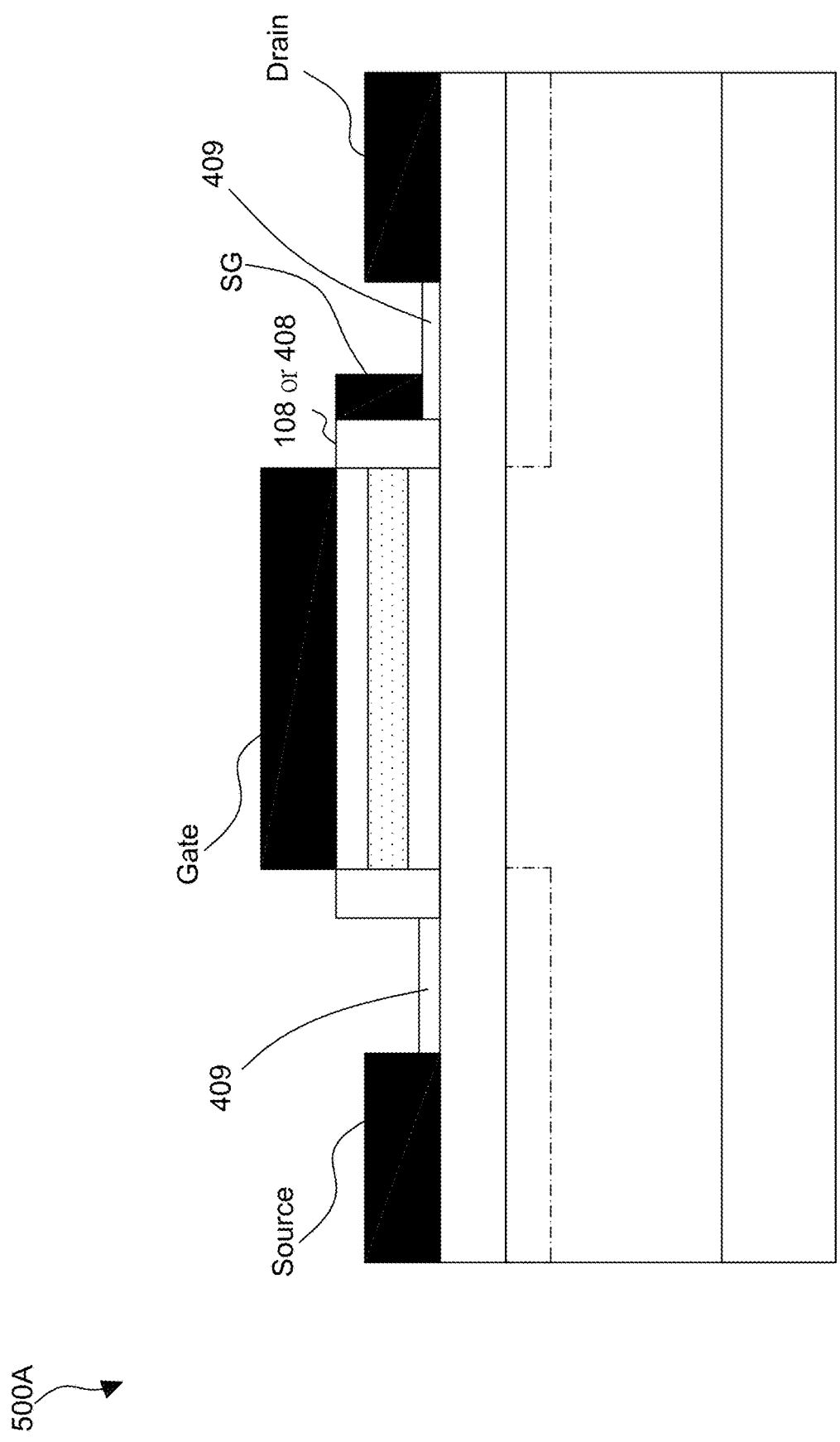
FIG. 2F is a schematic view showing a semiconductor structure for a wide bandgap normally off MOSFET according to an embodiment of the invention.
Figure 2G:
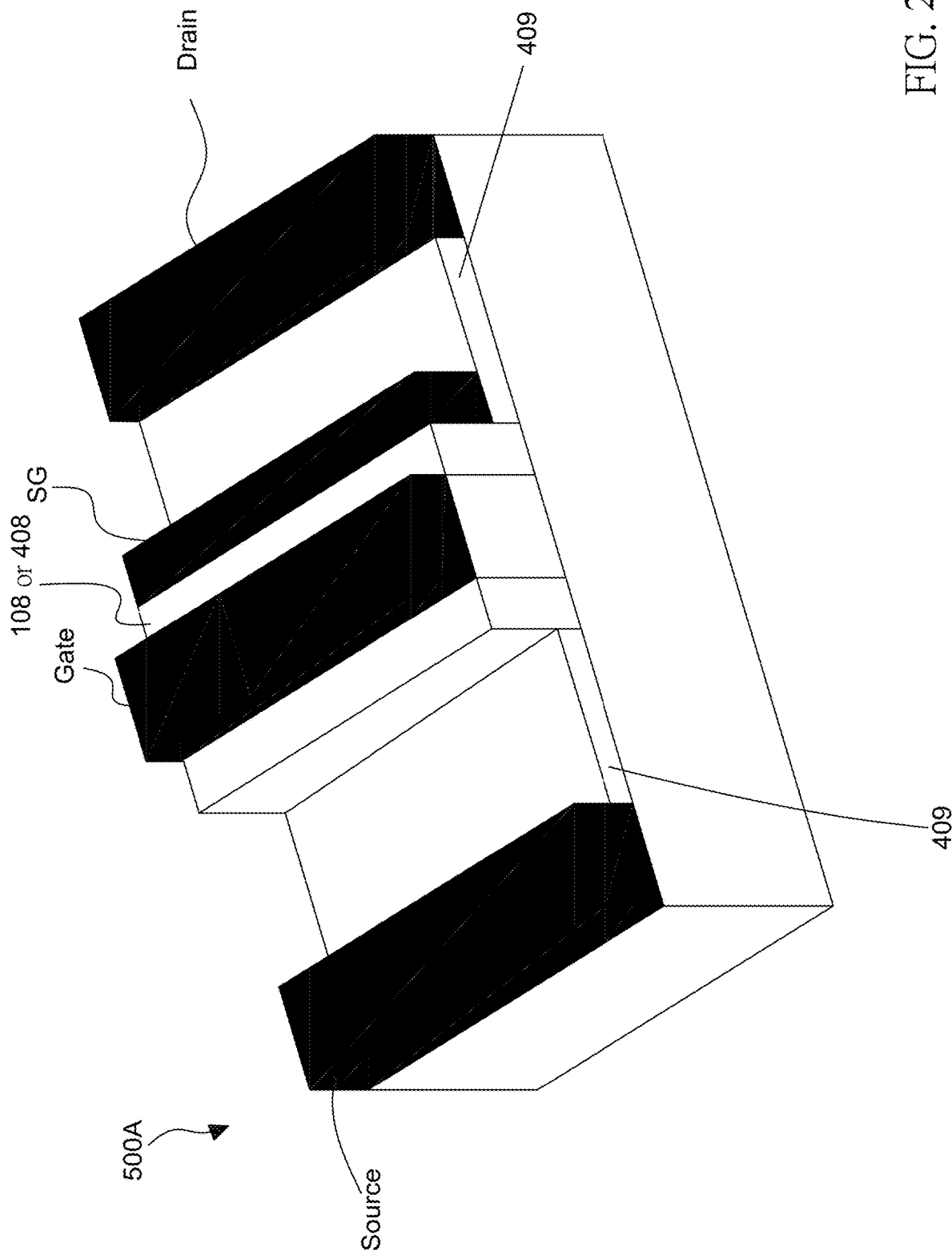
FIG. 2G shows a pictorial view of FIG. 2F.

FIG. 2F is a schematic view showing a semiconductor structure for a wide bandgap normally off MOSFET according to an embodiment of the invention. FIG. 2G shows a pictorial view of FIG. 2F. Referring to FIGS. 2F and 2G the difference between the structure 500A and the structure 400 or 300 is that the structure 500A includes an isolation layer 409, which is disposed between the gate electrode Gate and the drain electrode Drain, disposed on the barrier layer 103, and a shielding gate SG, which is disposed on the isolation layer 409 and disposed between the gate electrode Gate and the drain electrode Drain; the isolation layer 409 and the shielding gate SG may contact the oxide layer 108 or the dielectric layer 408.

Please note that the shielding gate SG and the source electrode Source can be connected together or respectively connected to the ground upon operating. At this time, the drain electrode Drain is a high voltage terminal, so the shielding gate SG can decrease the intensity of the electric field at the edge of the gate electrode Gate, and the temperature at the edge of the gate electrode Gate is correspondingly decreased, thereby avoiding the semiconductor being damaged at the edge of the gate electrode Gate.

In one embodiment, the material of the isolation layer 409 may be implemented by oxide, nitride, or a mixture of oxide and nitride.

Figure 3A:
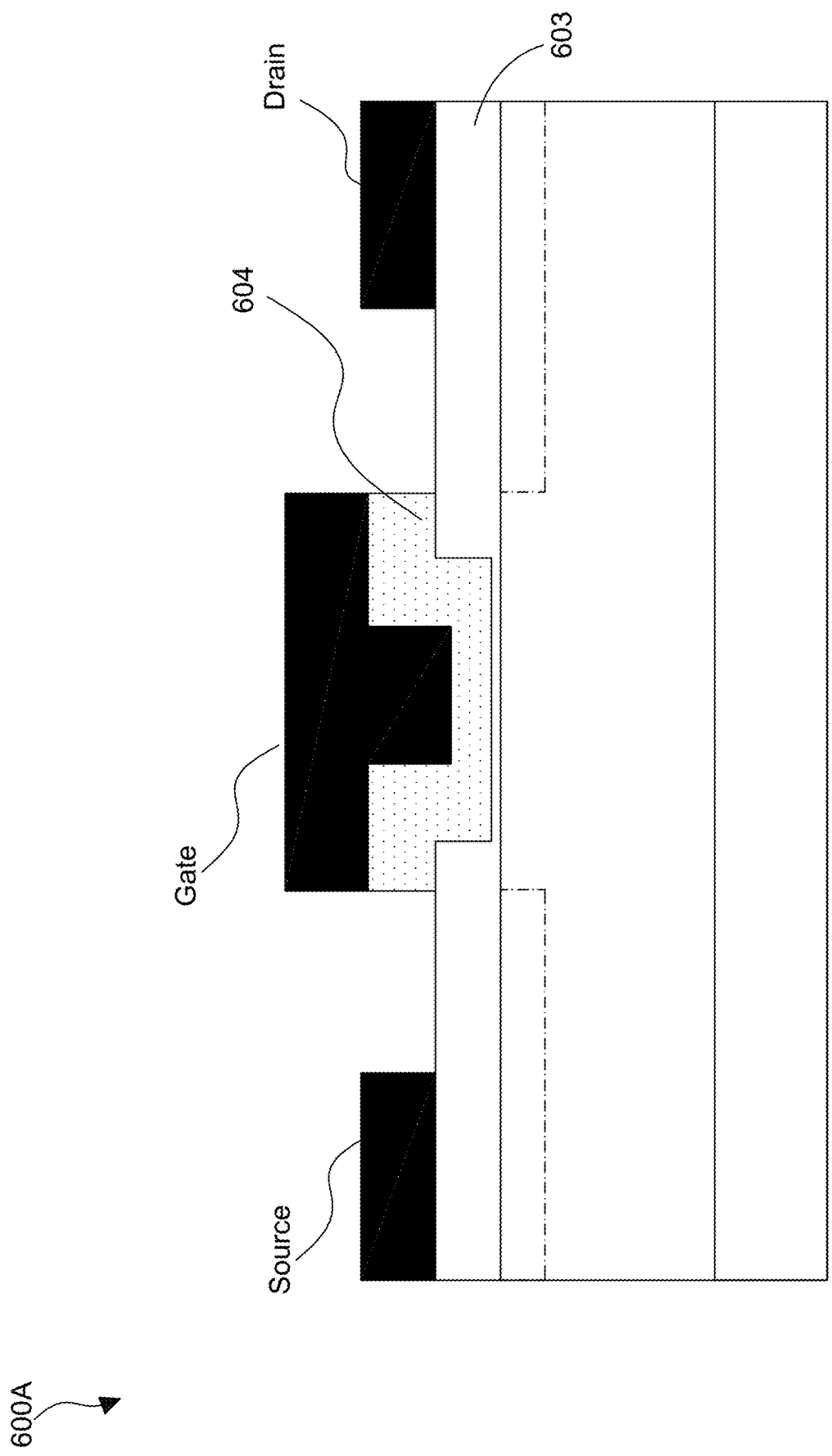
FIG. 3A is a schematic view showing a semiconductor structure for a wide bandgap normally off MOSFET according to an embodiment of the invention.

FIG. 3A is a schematic view showing a semiconductor structure 600A for a wide bandgap normally off MOSFET according to an embodiment of the invention. Referring to FIG. 3A, the difference between the structure 600A and the above-mentioned structure is that the gate electrode Gate is a T-shaped structure, and each of the trapping layer 604 and the barrier layer 603 has a notch, so that the gate electrode Gate, the trapping layer 604, and the barrier layer 603 are mutually embedded together. In addition, the bottom portion of the gate electrode Gate is closer to the 2DEG so the effect of electrons trapped in the trapping layer 604 to deplete the 2DEG is better than that of the structure mentioned above, where the other operation principles are the same as those mentioned hereinabove, and detailed descriptions thereof will be omitted here.

Figure 3B:
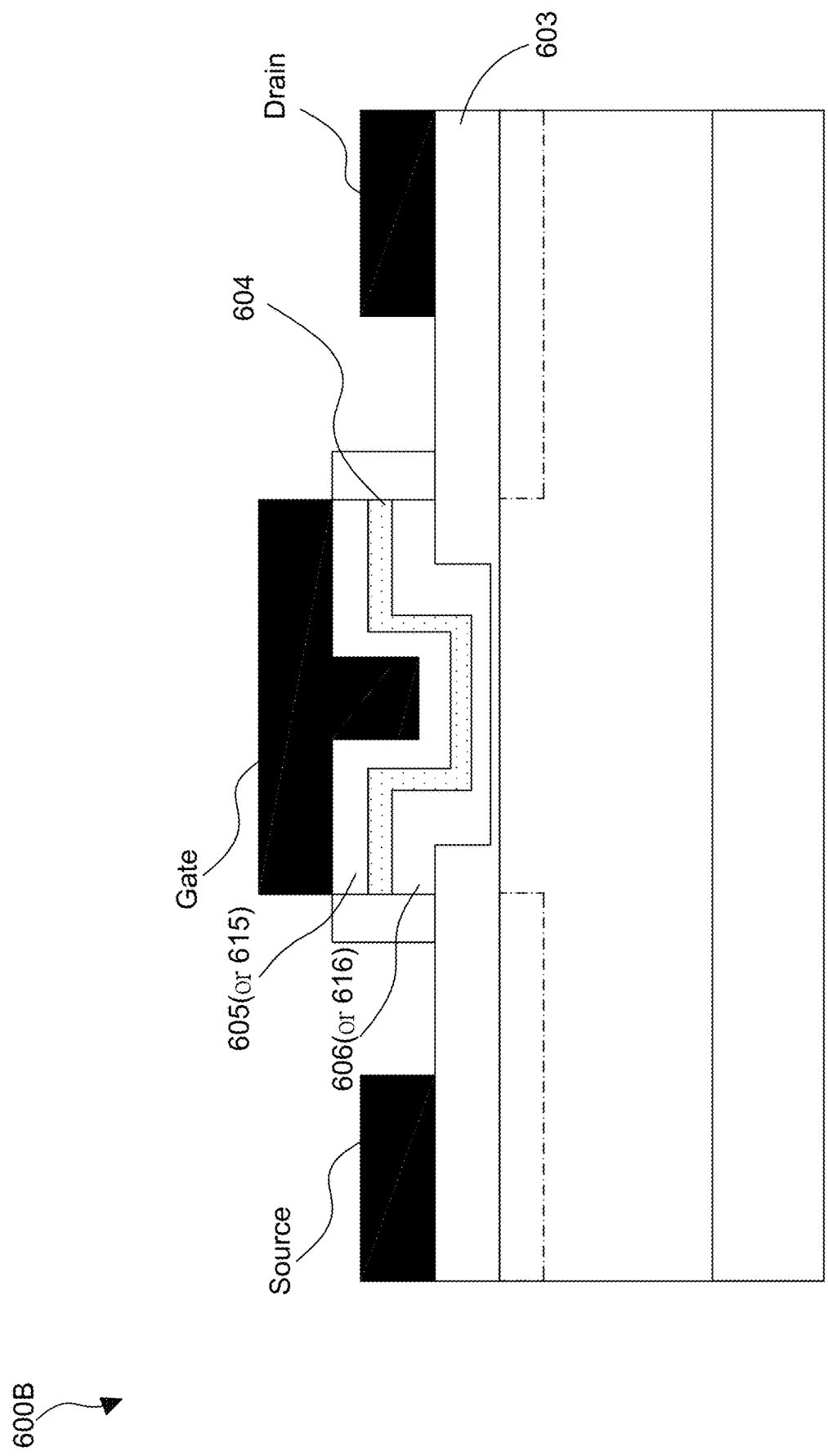
FIG. 3B is a schematic view showing a semiconductor structure for a wide bandgap normally off MOSFET according to an embodiment of the invention.

FIG. 3B is a schematic view showing a semiconductor structure 600B for a wide bandgap normally off MOSFET according to an embodiment of the invention. Referring to FIG. 3B, the difference between the structure 600B and the aforementioned structure resides in the gate electrode Gate is a T-shaped structure, and each of the dielectric layers 605 and 606 (or oxide layers 615 and 616), the trapping layer 604, and the barrier layer 603 has a notch, so that the gate electrode Gate, the dielectric layers 605 and 606 (or the oxide layers 615 and 616), the trapping layer 604, and the barrier layer 603 are mutually embedded together, whereas the other operation principles are the same as those mentioned hereinabove, and detailed descriptions thereof will be omitted here.

Figure 3C:
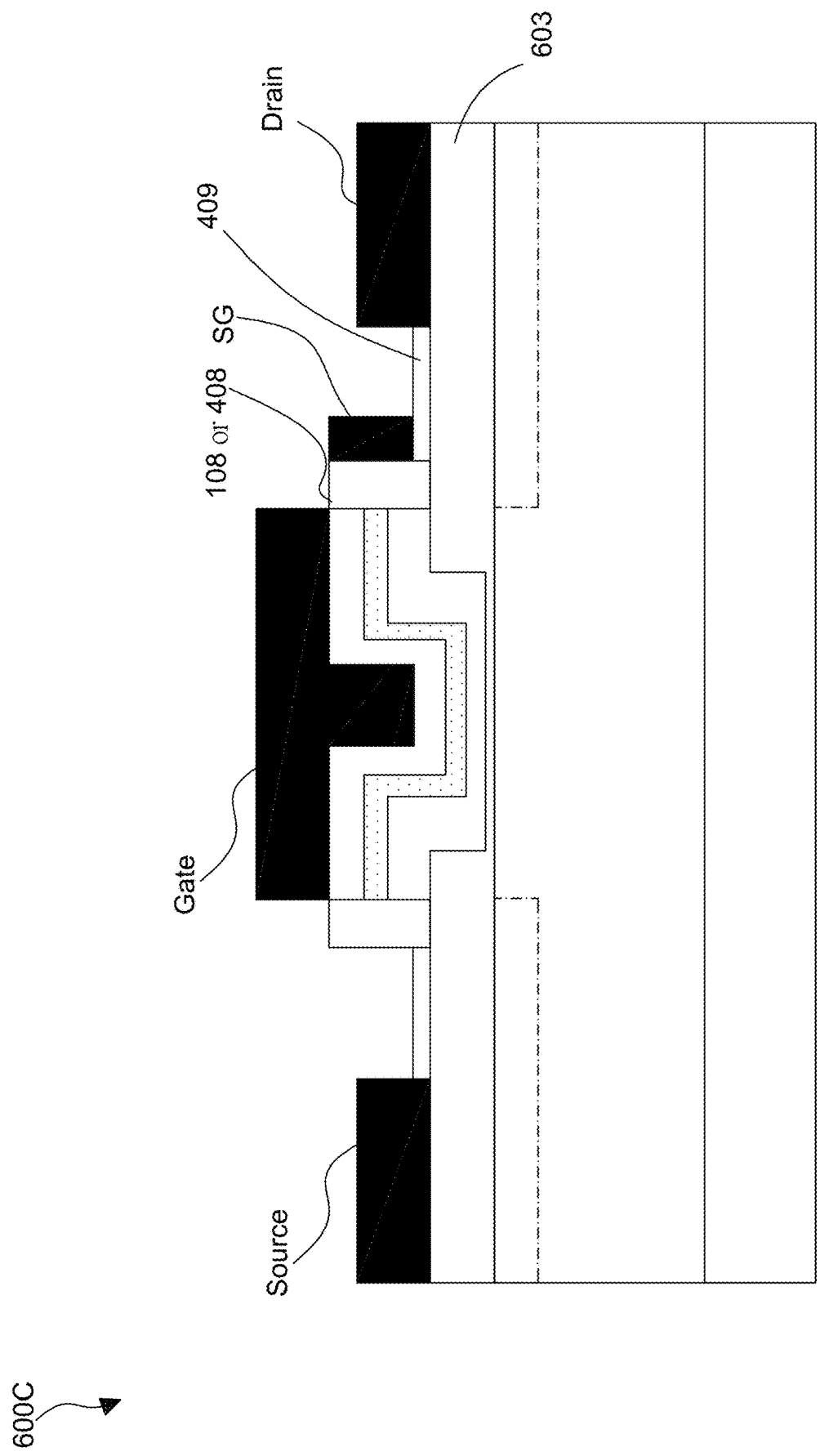
FIG. 3C is a schematic view showing a semiconductor structure for a wide bandgap normally off MOSFET according to an embodiment of the invention.

FIG. 3C is a schematic view showing a semiconductor structure 600C for a wide bandgap normally off MOSFET according to an embodiment of the invention. Referring to FIG. 3C, the difference between the structures 600C and 600B is that the structure 600C further includes: an isolation layer 409, which is disposed between the gate electrode Gate and the drain electrode Drain, and disposed on the barrier layer 103, and a shielding gate SG, which is disposed on the isolation layer 409 and disposed between the gate electrode Gate and the drain electrode Drain. The isolation layer 409 and the shielding gate SG may have contact with the oxide layer 108 or the dielectric layer 408.

Please note that the shielding gate SG and the source electrode Source can be connected together upon operating or respectively connecting to the ground. At this time, the drain electrode Drain is the high voltage terminal, so the shielding gate SG can decrease the intensity of the electric field at the edge of the gate electrode Gate, and the temperature at the edge of the gate electrode Gate is thus correspondingly decreased, thereby avoiding the semiconductor being damaged at the edge of the gate electrode Gate.

In one embodiment, the material of the isolation layer 409 may be implemented by oxide, nitride, or the mixture of oxide and nitride.

Figure 4A:
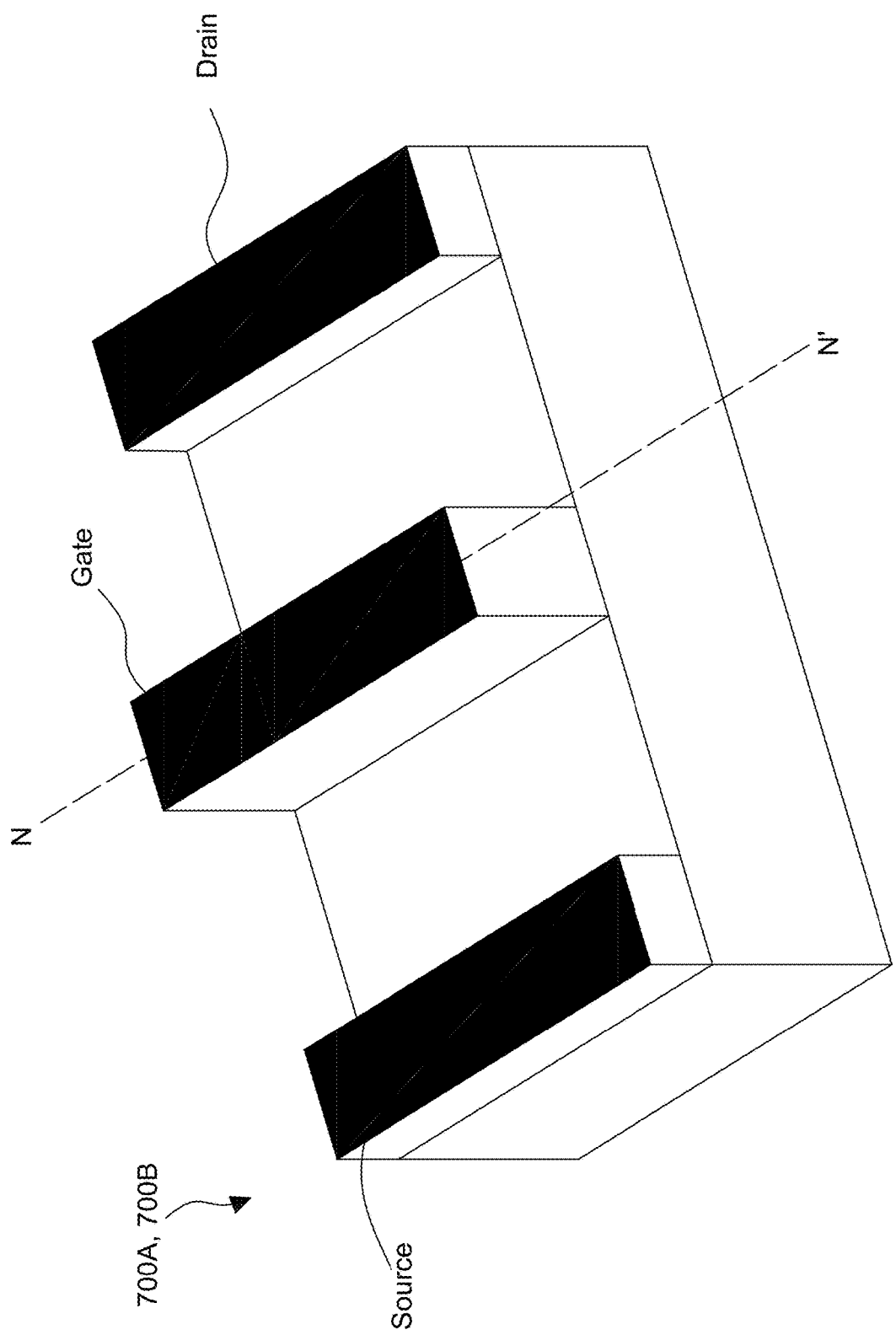
FIG. 4A is a schematic view showing a semiconductor structure for a wide bandgap normally off MOSFET according to an embodiment of the invention.
Figure 4B:
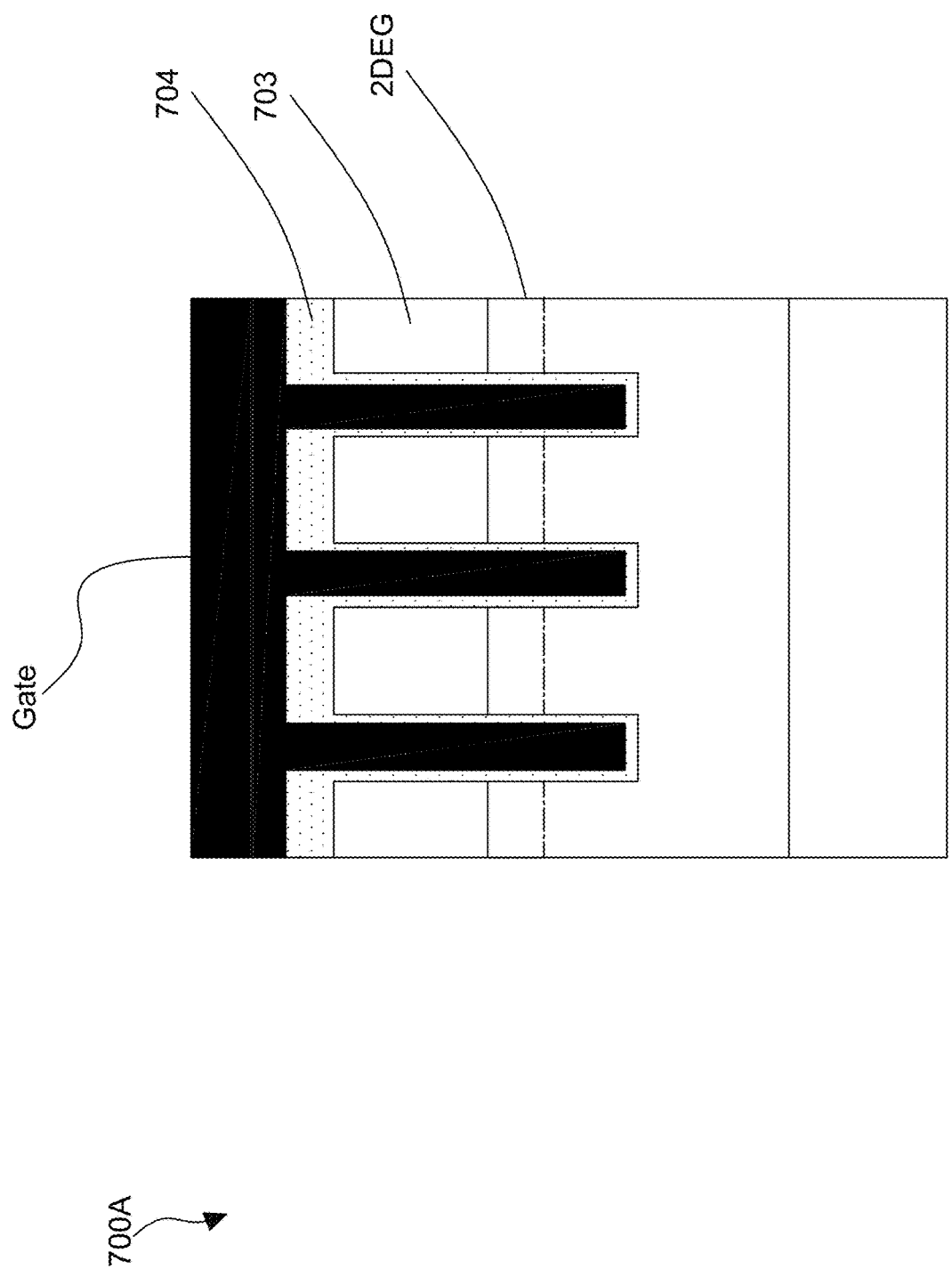
FIG. 4B shows a side view of the N-N' cross-section of FIG. 4A.

FIG. 4A is a schematic view showing a semiconductor structure 700A for a wide bandgap normally off MOSFET according to an embodiment of the invention, FIG. 4B shows a side view of the N-N' cross-section of FIG. 4A. Referring to FIGS. 4A and 4B, the difference between the structure 700A and the above-mentioned structure is that the gate electrode Gate has continuous convexes, and the barrier layer 703 has continuous concaves, wherein the continuous convexes of the gate electrode Gate accommodate the continuous concaves of the barrier layer 703, and the trapping layer 704 is disposed between the gate electrode Gate and the barrier layer 703. In addition, the bottom portion of the gate electrode Gate is closer to the 2DEG, so the effect of electrons trapped in the trapping layer 704 for depleting the 2DEG is better than that of the structure mentioned above. In addition, if N-N' is regarded as the x-axis, then the structure 700A has the gate electrodes Gate on the x-axis, y-axis and z-axis. Correspondingly, the structure 700A can deplete the 2DEG on the three axes. The other operation principles are the same as those mentioned hereinabove, and detailed descriptions thereof will be omitted here.

Figure 4C:
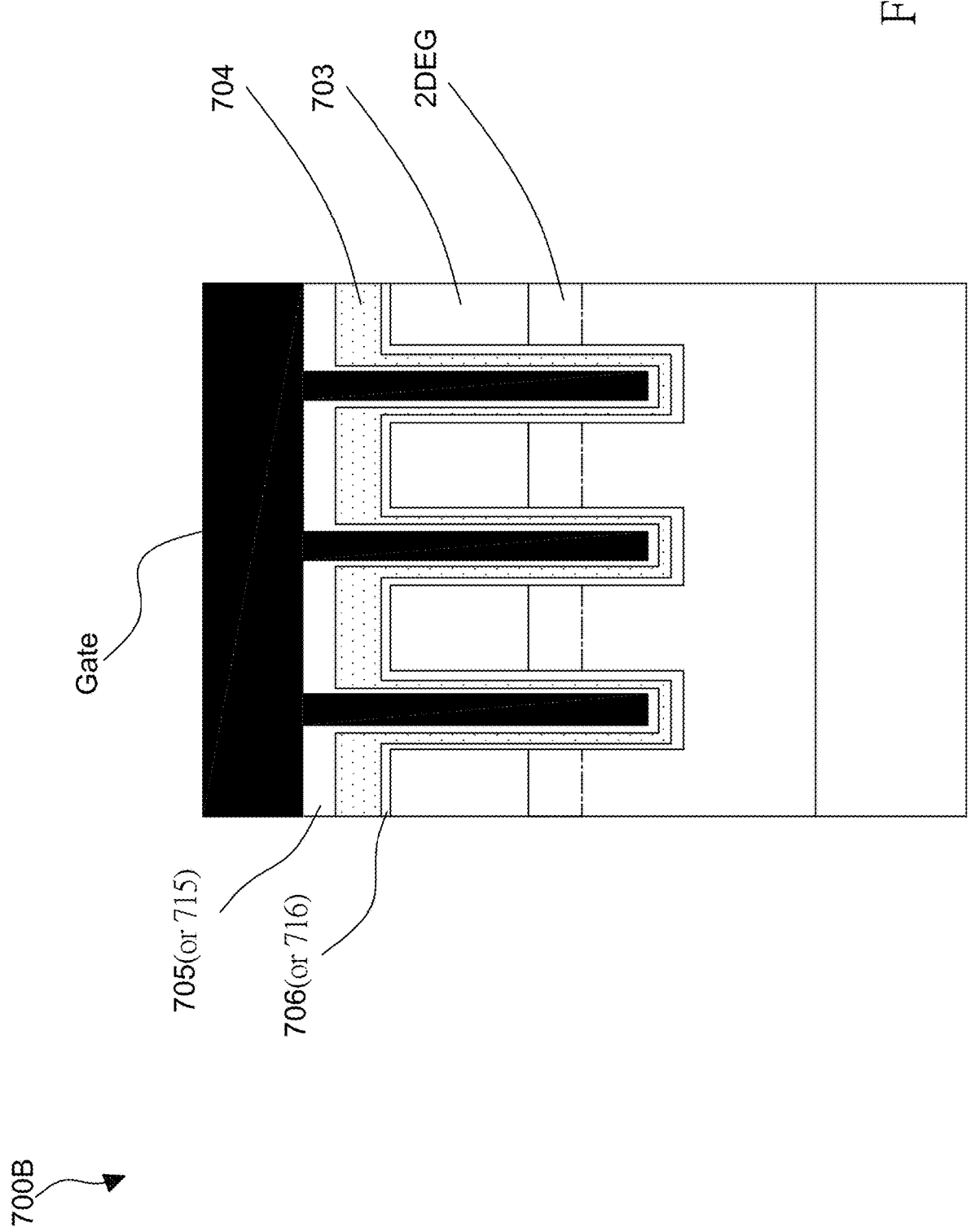
FIG. 4C shows a side view of the N-N' cross-section of FIG. 4A.

FIG. 4C is a schematic view showing a semiconductor structure 700B for a wide bandgap normally off MOSFET according to an embodiment of the invention, FIG. 4C shows a side view of the N-N' cross-section of FIG. 4A. Referring to FIGS. 4A and 4C, the difference between the structure 700B and the above-mentioned structure is that the barrier layer 703 has continuous concaves in addition to that the gate electrode Gate has continuous convexes, wherein the continuous convexes of the gate electrode Gate accommodate the continuous concaves of the barrier layer 703, and the trapping layer 704 is disposed between the gate electrode Gate and the barrier layer 703. In addition, the dielectric layer 705 (or oxide layer 715) is disposed between the gate electrode Gate and the trapping layer 704, and the dielectric layer 706 (or oxide layer 716) is disposed between the trapping layer 704 and the barrier layer 703. The other operation principles are the same as those mentioned hereinabove, and detailed descriptions thereof will be omitted here.

Please note that the 2DEG in FIGS. 4B and 4C are not depicted because the electrons in the trapping layer deplete the 2DEG below the trapping layer to form the normally off structure.

In one embodiment, the material of the trapping layer may be implemented by silicon dots, wherein the other operation principles are the same as those mentioned hereinabove, and detailed descriptions thereof will be omitted here.

In summary, the electrons in the invention are trapped by the trapping layer. Even though the oxide layer has defects during the manufactured process, the electrons still cannot leak out of the trapping layer. Also, the electrons trapped by the trapping layer would not flow in the trapping layer, so the electrons should not leak through the oxide layer or the dielectric layer, so the thickness of each of the upper and lower oxide layers or dielectric layers can be decreased. The electrons can be injected into the trapping layer by directly applying the voltage to the gate so that the normally off MOSFET is formed.

What is claimed is:

1. A semiconductor structure for a wide bandgap normally off MOSFET, comprising:
    a substrate;
    a buffer layer disposed on the substrate;
    a barrier layer, which is disposed on the buffer layer and covers the buffer layer, wherein an interface between the buffer layer and the barrier layer has a two-dimensional electron gas (2DEG);
    a source electrode;
    a drain electrode; and
    a gate electrode, wherein the source electrode and the drain electrode are disposed on the barrier layer, and the source electrode and the drain electrode are disposed on two opposite sides of the gate electrode to control a current flowing through the 2DEG;
    wherein a III-group nitride, a V-group nitride, or a high K material trapping layer is disposed under the gate electrode, and multiple electrons are trapped by the trapping layer and kept in the trapping layer through a FN tunneling effect or channel hot electron effect (CHE); and the electrons in the trapping layer deplete the 2DEG below the trapping layer, which make the 2DEG below the gate electrode disappear so that the semiconductor structure forms a normally off MOSFET semiconductor structure.

2. The semiconductor structure according to claim 1, further comprising:
    an oxide layer disposed between the gate electrode and the trapping layer, and disposed between the trapping layer and the barrier layer.

3. The semiconductor structure according to claim 2, wherein the oxide layer further covers both side surfaces of the trapping layer and the oxide layers.

4. The semiconductor structure according to claim 3, wherein the buffer layer and the barrier layer are made of an III-V group material.

5. The semiconductor structure according to claim 4, further comprising:
- an isolation layer disposed between the gate electrode and the drain electrode and disposed on the barrier layer; and
- a shielding gate disposed on the isolation layer and disposed between the gate electrode and the drain electrode.

6. The semiconductor structure according to claim 2, wherein the electrons are injected into the trapping layer by FN tunneling effect with a voltage of the gate electrode is higher than or equal to 10 volts, and the source electrode and the drain electrode are grounded; or by channel hot electron effect with a gate voltage is higher than or equal to 5V, a source voltage is ground and a drain voltage is higher than or equal to 3V.

7. The semiconductor structure according to claim 1, wherein when the trapping layer is the III-group nitride or the V-group nitride, the semiconductor structure further comprises:

a dielectric layer disposed between the gate electrode and the trapping layer, and disposed between the trapping layer and the barrier layer.

8. The semiconductor structure according to claim 7, wherein the dielectric layer further covers both side surfaces of the trapping layer and the dielectric layers.

9. The semiconductor structure according to claim 8, wherein the buffer layer and the barrier layer are made of an III-V group material.

10. The semiconductor structure according to claim 9, further comprising:

an isolation layer disposed between the gate electrode and the drain electrode and disposed on the barrier layer; and a shielding gate disposed on the isolation layer and disposed between the gate electrode and the drain electrode.

\* \* \* \* \*